(12) United States Patent
Feng et al.

(10) Patent No.: US 7,839,195 B1
(45) Date of Patent: Nov. 23, 2010

(54) AUTOMATIC CONTROL OF CLOCK DUTY CYCLE

(75) Inventors: Xiaoxin Feng, Shakopee, MN (US); Weston Roper, Shakopee, MN (US); James D. Seefeldt, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/455,572

(22) Filed: Jun. 3, 2009

(51) Int. Cl.
*H03K 5/04* (2006.01)
*H03L 7/06* (2006.01)

(52) U.S. Cl. .................. 327/175; 327/147; 327/156; 327/172; 327/176

(58) Field of Classification Search ............ 327/31, 327/33–38, 146–150, 155–159, 161–163, 327/172–176
See application file for complete search history.

(56) References Cited

U.S. PATENT DOCUMENTS

| | | | |
|---|---|---|---|
| 5,907,254 A | 5/1999 | Chang | |
| 6,198,322 B1 | 3/2001 | Yoshimura | |
| 6,320,437 B1* | 11/2001 | Ma | 327/175 |
| 6,320,438 B1 | 11/2001 | Arcus | |
| 6,456,133 B1 | 9/2002 | Nair et al. | |
| 6,459,314 B2* | 10/2002 | Kim | 327/161 |
| 6,583,657 B1 | 6/2003 | Eckhardt et al. | |
| 6,593,789 B2 | 7/2003 | Atallah et al. | |
| 6,670,838 B1 | 12/2003 | Cao | |
| 6,781,419 B2 | 8/2004 | Harrison | |
| 6,833,743 B2 | 12/2004 | Gu et al. | |
| 6,882,196 B2* | 4/2005 | Yee et al. | 327/175 |
| 6,940,328 B2 | 9/2005 | Lin | |
| 7,164,304 B2 | 1/2007 | Sekimoto | |
| 7,199,632 B2 | 4/2007 | Chun et al. | |
| 7,298,193 B2* | 11/2007 | Agarwal et al. | 327/175 |
| 7,463,075 B2 | 12/2008 | White | |
| 2001/0052805 A1 | 12/2001 | Kim | |
| 2003/0151435 A1 | 8/2003 | Ma | |
| 2004/0012428 A1 | 1/2004 | Yee et al. | |
| 2006/0103441 A1 | 5/2006 | Carpenter et al. | |
| 2007/0182470 A1 | 8/2007 | Heyne | |
| 2007/0247234 A1 | 10/2007 | Roper | |

* cited by examiner

*Primary Examiner*—Lincoln Donovan
*Assistant Examiner*—Patrick O'Neill
(74) *Attorney, Agent, or Firm*—Shumaker & Sieffert, P.A.

(57) ABSTRACT

In general, this disclosure is directed to a duty cycle correction (DCC) circuit that adjusts a falling edge of a clock signal to achieve a desired duty cycle. In some examples, the DCC circuit may generate a pulse in response to a falling edge of an input clock signal, delay the pulse based on a control voltage, adjust the falling edge of the input clock signal based on the delayed pulse to produce an output clock signal, and adjust the control voltage based on the difference between a duty cycle of the output clock signal and a desired duty cycle. Since the DCC circuit adjusts the falling edge of the clock cycle to achieve a desired duty cycle, the DCC may be incorporated into existing PLL control loops that adjust the rising edge of a clock signal without interfering with the operation of such PLL control loops.

20 Claims, 9 Drawing Sheets

AUTOMATIC CONTROL OF CLOCK DUTY CYCLE

GOVERNMENT RIGHTS

The United States Government has acquired certain rights in this invention pursuant to Contract No. NNJ06TA25C, awarded by NASA Johnson Space Center.

TECHNICAL FIELD

This disclosure relates to clock signal management, and more specifically, to duty cycle correction circuits for a clock signal.

BACKGROUND

A phase-locked loop (PLL) is often utilized within clock generation and distribution systems of an integrated circuit. In general, a PLL generates an output signal having a phase that is matched to the phase of a reference signal. The PLL is typically implemented as a control loop with the output signal being used as a negative feedback signal to control the PLL. The PLL includes a phase detector that compares the reference clock signal to the feedback clock signal to determine whether the phases of the reference clock signal and the feedback clock signal are aligned.

In many PLLs, the phase detector will detect the rising edges of both signals to make this determination. Likewise, the control loop within the PLL generally moves only the rising edge of the output clock signal in order to achieve phase lock. At the same time, many existing duty cycle correction (DCC) circuits adjust both the rising and falling edges of a clock signal in order to achieve a desired duty cycle for the clock signal. Because the PLL and the DCC control loops both adjust the rising edge of the output clock signal, integrating a DCC within the control loop of a PLL can cause interference with the operation of the PLL.

SUMMARY

In general, this disclosure is directed to a duty cycle correction (DCC) circuit configured to adjust a falling edge of a clock signal, and thereby adjust the duty cycle of the clock signal. The DCC may generate a pulse in response to a falling edge of an input clock signal. A feedback network compares the duty cycle of the output clock signal with a desired duty cycle and generates a control signal, which is used for delaying the pulse. An edge adjustment circuit adjusts the falling edge of the input clock signal based on the amount of delay in the delayed pulse. Since the DCC circuit adjusts the falling edge of the clock cycle to achieve a desired duty cycle, the DCC circuit may be incorporated into existing PLL control loops that adjust the rising edge of a clock signal without interfering with the operation of such PLL control loops.

In one example, the disclosure is directed to a duty cycle correction circuit device that includes a pulse generator configured to generate a pulse in response to a falling edge of an input clock signal. The device further includes a voltage-controlled delay circuit configured to delay the pulse based on a control voltage. The device further includes an edge adjustment circuit configured to adjust the falling edge of the input clock signal based on the delayed pulse to produce an output clock signal. The device further includes a feedback circuit path configured to adjust the control voltage based on the difference between a duty cycle of the output clock signal and a desired duty cycle.

In another example, the disclosure is directed to a method that includes generating a pulse in response to a falling edge of an input clock signal. The method further includes delaying the pulse based on a control voltage. The method further includes adjusting the falling edge of the input clock signal based on the delayed pulse to produce an output clock signal. The method further includes adjusting the control voltage based on the difference between a duty cycle of the output clock signal and a desired duty cycle.

In another example, the disclosure is directed to a clock synthesizer system that includes a phase-locked loop forward circuit path configured to generate an intermediate clock signal based on a reference clock signal and a feedback clock signal. The system further includes a duty cycle correction circuit configured to adjust the falling edge of the intermediate clock signal to produce an output clock signal. The system further includes a feedback circuit path configured to apply the output clock signal to the phase-locked loop forward circuit path as the feedback clock signal.

In another example, the disclosure is directed to a method that includes generating an intermediate clock signal based on a reference clock signal and a feedback clock signal. The method further includes adjusting the falling edge of the intermediate clock signal to produce an output clock signal. The method further includes applying the output clock signal to the phase-locked loop forward circuit path as the feedback clock signal.

The details of one or more examples are set forth in the accompanying drawings and the description below. Other features, objects, and advantages will be apparent from the description and drawings, and from the claims.

DETAILED DESCRIPTION

In general, this disclosure is directed to a duty cycle correction (DCC) circuit configured to adjust a falling edge of a clock signal. As used herein, a falling edge of a clock signal may refer to a transition within the clock signal from a high logic value to a low logic value. The DCC may generate a pulse in response to a falling edge of an input clock signal. A feedback network compares the duty cycle of the output clock signal with a desired duty cycle and generates a control signal, which is used for delaying the pulse. An edge adjustment circuit adjusts the falling edge of the input clock signal based on the amount of delay in the delayed pulse. Since the DCC circuit adjusts the falling edge of the clock cycle to achieve a desired duty cycle, the DCC circuit may be incorporated into existing PLL control loops that adjust the rising edge of a clock signal without interfering with the operation of such PLL control loops.

Figure 1:
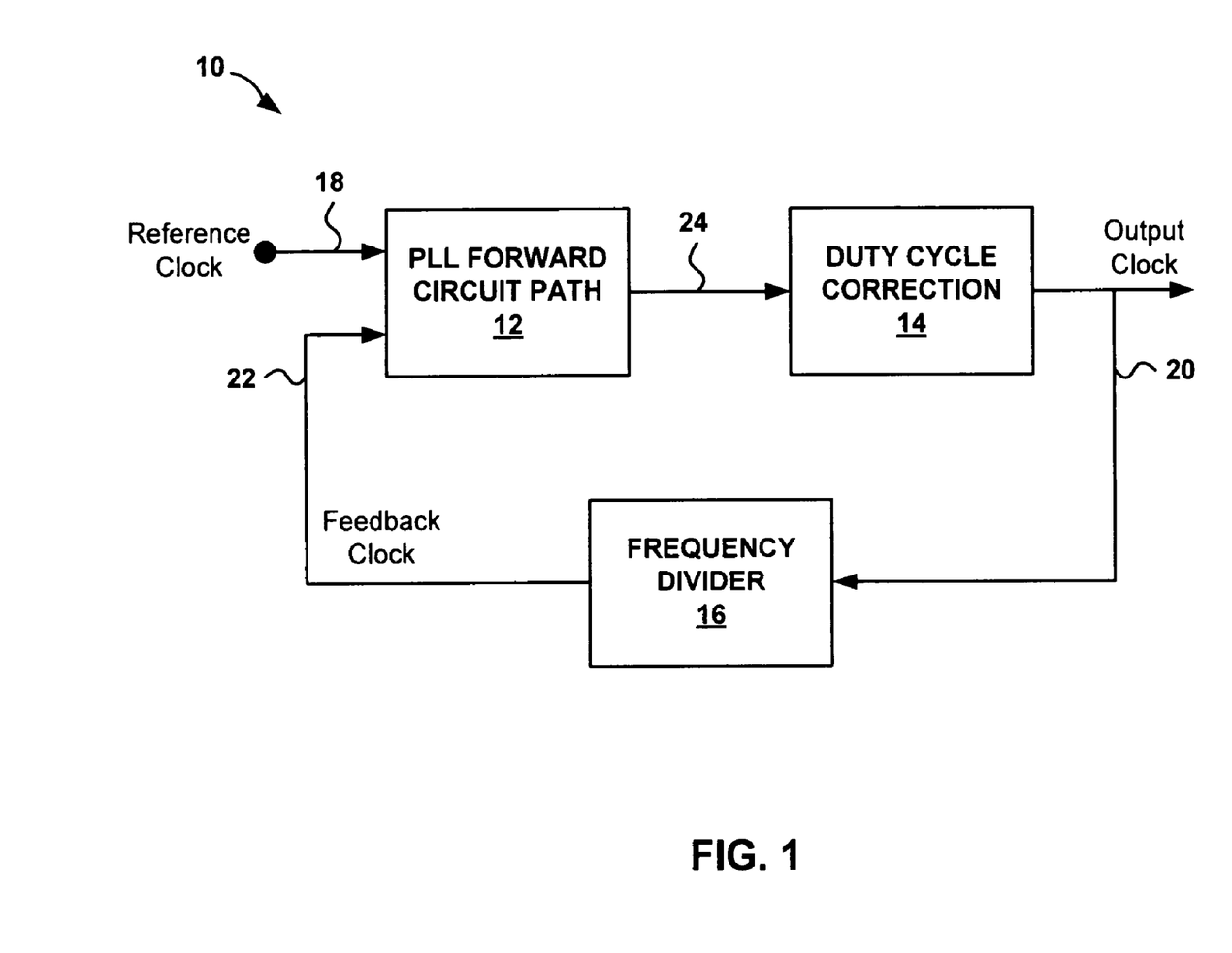
FIG. 1 is a block diagram illustrating an example clock synthesizer system according to this disclosure.

FIG. 1 is a block diagram illustrating an example clock synthesizer system 10 according to this disclosure. Clock synthesizer system 10 generates an output clock signal that is phase-aligned with a reference clock signal and has a frequency that is a multiple of the frequency of the reference clock. Clock synthesizer system 10 includes a phase-locked loop (PLL) forward circuit path 12, a duty cycle correction (DCC) circuit 14, a frequency divider 16, a reference clock signal 18, an output clock signal 20, and signal nodes 22, 24.

PLL forward circuit path 12 is configured to generate a phase-adjusted signal 24 that is phase-aligned with a reference clock signal 18. PLL forward circuit path 12 receives feedback signal 22, which is used to control the phase and/or frequency of phase-adjusted signal 24. In general, PLL forward circuit path 12 determines a phase difference between reference clock signal 18 and feedback clock signal 22, and adjusts the frequency of phase-adjusted signal 24 such that the resulting phase and frequency of feedback signal 22 matches, or has a fixed relation to, the phase and frequency of reference clock signal 18. In one example, PLL forward circuit path 12 determines the phase difference by measuring a time difference between the rising edges of reference clock signal 18 and feedback clock signal 22.

PLL forward circuit path 12 may include any components that are generally found in the forward circuit path of an analog or digital PLL control loop. As used herein, forward circuit path refers to all of or a portion of a PLL control loop that is not part of the feedback path of such control loop. In one example, PLL forward circuit path 12 may include a phase detector, a loop filter, and a voltage-controlled oscillator (VCO). The phase detector compares the phase and/or frequency of feedback signal 22 relative to reference clock signal 18 and generates an error signal based on the phase difference between these signals. The loop filter filters the error signal to remove higher order frequency components from the error signal and to produce a filtered error signal. The VCO generates an output clock signal having a frequency that is determined by the filtered error signal.

PLL forward circuit path 12 is described above is merely an exemplary PLL forward circuit path. It should understood that any forward circuit path that is capable of implementing PLL functionality may be used for PLL forward circuit path 12 in clock synthesizer system 10 of FIG. 1. PLL forward circuit path 12 may include different components than described above and/or components arranged in the same or different order without departing from the scope of this disclosure. For example, PLL forward circuit path 12 may include a digital phase detector, a counter, and a digitally-controlled oscillator. As another example, PLL forward circuit path 12 may be implemented without a loop filter. In any case, PLL forward circuit path 12 includes components that provide the functionality for all of or a portion of a PLL control loop excluding the feedback contained with the control loop.

DCC circuit 14 is configured to adjust the duty cycle of phase-adjusted signal 24 in order to generate output clock signal 20. The steady-state output of DCC circuit 14 has a duty cycle that is substantially matched to a desired duty cycle. According to this disclosure, DCC circuit 14 adjusts the timing of the falling edge of phase-adjusted signal 24 in order to achieve the desired duty cycle. Since DCC circuit 14 adjusts the falling edge of the output clock signal to achieve a desired duty cycle, DCC circuit 14 may be incorporated into existing PLL control loops that adjust the rising edge of a clock signal without interfering with the operation of such PLL control loops.

In one example, DCC circuit 14 generates a pulse in response to a falling edge of an input clock signal, delays the pulse based on a control voltage, adjusts the falling edge of the input clock signal based on the delayed pulse to produce an output clock signal, and adjusts the control voltage based on the difference between a duty cycle of the output clock signal and a desired duty cycle. In this manner, DCC circuit 14 provides a control loop that controls the falling edge of output clock signal 20 in order to achieve a desired duty cycle.

In some examples, DCC circuit 14 may contain a sequential circuit element with an asynchronous reset input that forces output clock signal 20 to a low logic value when a pulse is received at the input. In some cases, the sequential circuit element may also force output clock signal 20 to a high logic value when a rising edge is received from incoming, phase-adjusted clock signal 24. Thus, the sequential circuit element of DCC circuit 14 may adjust the duty cycle of incoming clock signal 24 without disturbing and/or adjusting the rising edge of output clock signal 20.

In additional examples, DCC circuit 14 may include an analog feedback loop that does not require the use of a pre-existing external clock or oscillator to control the feedback loop. In such examples, the analog feedback loop may utilize a reference voltage input that can be used to adjust the desired duty cycle after construction of the circuit. By using a reference voltage within an analog feedback loop, as opposed to a digital feedback loop or state machines, the desired duty cycle can be more precisely programmed and/or adjusted in some examples.

In further examples, DCC circuit 14 may include a voltage-controlled delay unit that utilizes current-starved inverters for adjustment of the pulse delay. In such examples, the control voltage may, in some cases, adjust the current flowing into the current-starved inverters from both the high voltage power supply and from the low voltage power supply.

In additional examples, DCC circuit 14 captures the falling edge of incoming clock signal 24 in order to generate a pulse used for controlling the falling edge of output clock signal 20. By generating a pulse based on the falling edge of the incoming clock signal, rather than the rising edge, a more compact delay circuit can be implemented because the operating range of the delay parameter is effectively reduced. In addition, when the pulse is based on the falling edge of the incoming clock signal, the overall amount of delay required for the pulse can be reduced, allowing for more stable operation of the clock synthesizer control loop.

Frequency divider 16 is configured to generate a frequency-divided output clock signal 22 based on output clock signal 20. Frequency divider 16 reduces the frequency by a pre-set or programmed factor. The frequency-divided output clock signal may be applied to PLL forward circuit path 12 along a feedback path. Frequency divider 16 may be configured to receive a programmable integer, N, which is used as the divisor for the frequency division. In one example, frequency divider 16 may be implemented as a modulo-N counter. The modulo-N counter may increase its count by a value of one for each period of output clock cycle 20. The modulo-N counter produces feedback clock signal 22 such that the period of feedback clock signal 22 is defined according to the time required for modulo-N counter to cycle through all N states. In this manner, frequency divider 16 divides the frequency of output clock signal 20 to produce feedback clock signal 22. Although described above with respect to a digital counter, it should be recognized that frequency divider 16 can be implemented using other analog and/or digital techniques known in the art.

During operation of clock synthesizer system 10, PLL forward circuit path 12 receives reference clock signal 18 and feedback clock signal 22. PLL forward circuit path 12 generates phase-adjusted signal 24 based on a phase difference between reference clock signal 18 and feedback signal 20. PLL forward circuit path 12 uses the rising edges of signals 18, 20 to determine the phase difference. Based on this phase difference, PLL forward circuit path 12 adjusts the rising edge of phase-adjusted signal 24 to achieve a fixed amount of phase delay (i.e., phase lock). Phase-adjusted signal 24 is fed into DCC circuit 14.

DCC circuit 14 adjusts the duty cycle of phase-adjusted signal 24 such that the duty cycle of output clock signal 20 is substantially equal to a desired duty cycle. In particular, DCC circuit 14 adjust the duty cycle by adjusting the falling edge of the phase-adjusted clock signal 24 without varying the rising edge of phase-adjusted clock signal 24. Frequency divider 16 reduces the frequency of output signal 20 by a programmable factor, N. Frequency-divided clock signal 16 is applied to PLL forward circuit path 12 as feedback signal 22. Since PLL forward circuit path 12 attempts to match both the frequency and phase of reference clock signal 18 and feedback clock signal 20, PLL forward circuit path 12 adjusts phase-adjusted signal 24 such that the frequency of phase-adjusted signal 24 is N times the frequency of reference clock signal 18. In this manner, clock synthesizer system 10 provides a phase-locked and duty-cycle corrected output signal having a frequency that is a multiple of the reference clock signal frequency.

Although the example clock synthesizer system 10 in FIG. 1 is depicted as including a frequency divider, it should be understood that other example clock synthesizers that utilize the techniques of this disclosure may not utilize a frequency divider. In such cases, the techniques in this disclosure may provide a combined PLL-DCC control loop without stepping up the frequency.

Figure 2:
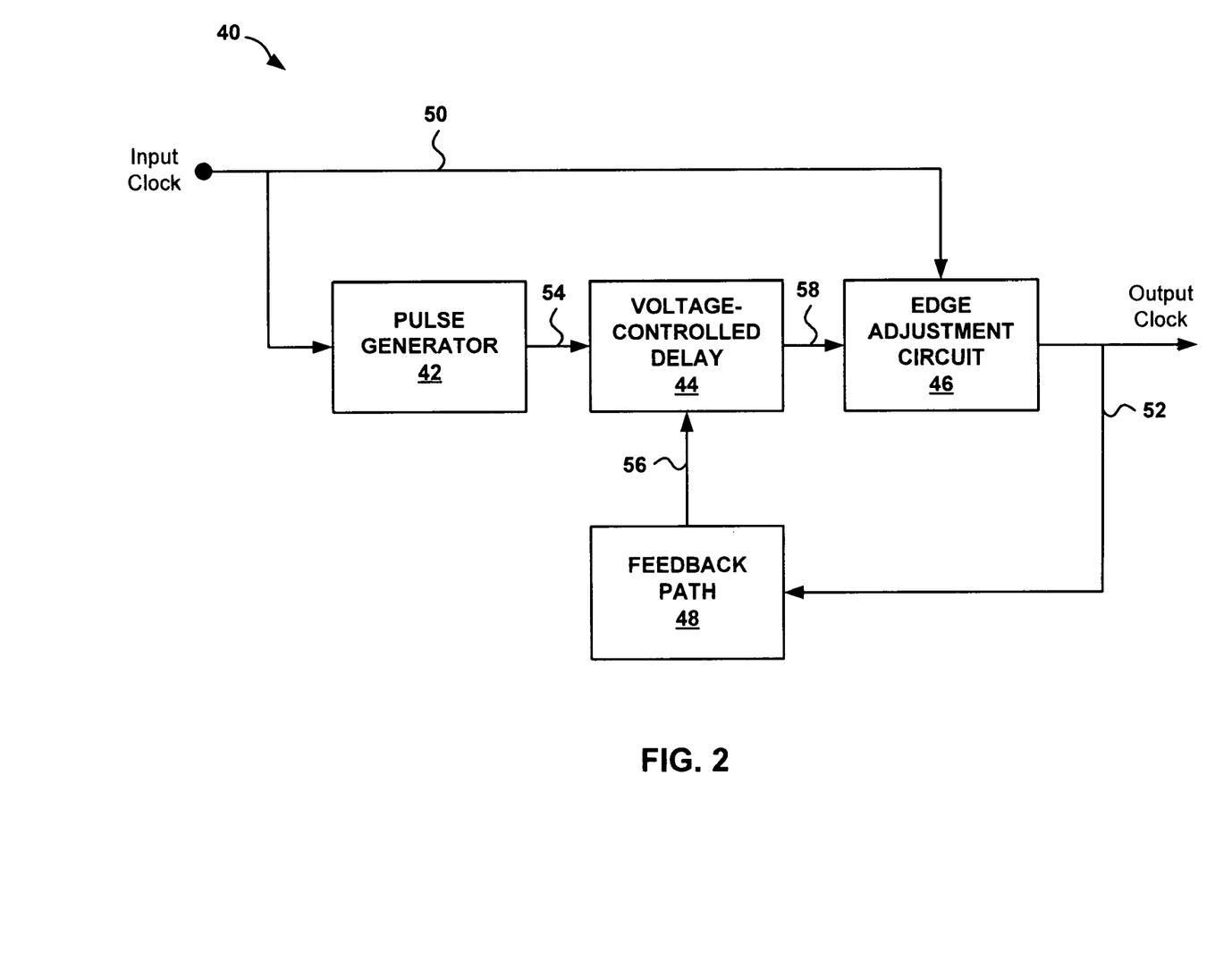
FIG. 2 is a block diagram illustrating an example duty cycle correction (DCC) circuit device according to this disclosure.

FIG. 2 is a block diagram illustrating an example duty cycle correction (DCC) circuit 40 device according to this disclosure. DCC circuit 40 is configured to adjust the falling edge of an input clock signal to produce an output clock signal having a duty cycle substantially equal to a desired duty cycle. In some examples, DCC circuit 40 of FIG. 2 may be used to form DCC circuit 14 of FIG. 1. DCC circuit 40 includes a pulse generator 42, a voltage-controlled delay unit 44, an edge adjustment circuit 46, a feedback path 48, an input clock signal 50, an output clock signal 52, and signal nodes 54, 56, 58.

Pulse generator 42 is configured to generate a pulse in response to a falling edge of an input clock signal. Pulse generator 42 may be implemented with combinatorial logic, sequential logic and/or analog circuits as is known in art. In some examples, DCC circuit 40 captures the falling edge of an incoming clock signal in order to generate a pulse signal 54 used for controlling the falling edge of output clock signal 20. By generating a pulse based on the falling edge of the incoming clock signal, rather than the rising edge, a more compact delay circuit can be implemented because the operating range of the delay parameter is effectively reduced.

Voltage-controlled delay unit 44 is configured to receive pulse signal 54 generated by pulse generator 42, and to delay pulse signal 54 based on a control voltage 56. In some examples, voltage-controlled delay unit 44 may includes a voltage-to-current converter followed by one or more current-starved inverters. In some cases, the supply current for both the high voltage supply and the low voltage supply may be adjusted based on the control voltage.

In any case, voltage-controlled delay unit 44 generates a delayed pulse signal 58 corresponding to pulse signal 54. The amount of delay is controlled by control voltage 56. Because pulse signal 54 is based on the falling edge of input clock signal 50, as opposed to the rising edge, the overall amount of delay required to achieve a desired duty cycle can be reduced thereby allowing for more stable operation of the clock synthesizer control loop.

Edge adjustment circuit 46 is configured to adjust the falling edge of input clock signal 50 based on delayed pulse signal 58 in order to produce an output clock signal 52. In some examples, edge adjustment circuit 46 may include one or more sequential circuit elements. The sequential circuit element may be configured to force output clock signal 52 to a low logic value when a pulse is detected within pulse signal 58. In some examples, the sequential circuit element may also force output signal 52 to a high logic value when a rising edge is detected within incoming clock signal 50. Thus, the sequential circuit element may adjust the duty cycle of incoming clock signal 24 without disturbing and/or adjusting the rising edge of output clock signal 20. In other examples, edge adjustment circuit 46 may be implemented with other types of combinatorial and/or analog circuitry.

Feedback path 48 is configured to adjust control voltage signal 56 based on the difference between a duty cycle of output clock signal 52 and a desired duty cycle. The desired duty cycle may be hard-wired or programmed into feedback path 48. In some examples, a reference voltage input controls the desired duty cycle.

In some examples, feedback path 48 may include circuitry that measures the duty cycle of output clock signal 52 by generating a first voltage substantially proportional to the duty cycle of the output clock. Feedback path 48 may compare the first voltage to a reference voltage representative of a desired duty cycle, and output a control voltage substantially proportional to a difference between the measured duty cycle and the reference voltage. In additional examples, feedback path 48 may be implemented as an analog feedback path, which does not require the use of a pre-existing external clock or oscillator to control the feedback loop.

During operation of DCC circuit 40, pulse generator 42 receives input clock signal 50, and generates a pulse signal 54 in response to a falling edge of input clock signal 50. Voltage-controlled delay unit 44 delays the pulse based on a control voltage 54 and outputs the delayed pulse as delayed pulse signal 58. Control voltage 54 controls the amount of delay applied to pulse signal 54 by delay unit 44. In one example, as control voltage 56 increases, the amount of delay produced by delay unit 44 decreases. Similarly, as control voltage 56 decreases, the amount of delay produced by delay unit 44 increases.

Edge adjustment circuit 46 receives input clock signal 50 and delayed pulse signal 58, and adjusts the falling edge of input clock signal 50 based on delayed pulse signal 58 to produce output clock signal 52. When edge adjustment circuit 46 detects a rising edge on input clock signal 50, edge adjustment circuit 46 forces output clock signal 52 to a high logic value. When edge adjustment circuit 46 detects a pulse on delayed pulse signal 58, edge adjustment circuit 46 forces output clock signal 52 to a low logic value.

Feedback circuit path 48 adjusts control voltage 56 based on the difference between a duty cycle of output clock signal 52 and a desired duty cycle. In other words, feedback circuit path 48 determines the duty cycle of output clock signal 52, compares the measured duty cycle to a desired duty cycle, and adjusts control voltage 56 based on the difference between the measured duty cycle and desired duty cycle. In this manner DCC circuit 40 regulates output clock signal 52 substantially at a desired duty cycle.

In some examples, a fixed delay unit may be placed between input clock signal 50 and edge adjustment circuit 46. In such examples, the fixed delay unit is configured to delay input clock signal 50 by a fixed amount. In such examples, the delayed clock signal may be fed into edge adjustment circuit 46 instead of input clock signal 50.

Although described with respect to a voltage-controlled delay unit 44, it should be understood that, in some examples, a current-controlled delay unit may be substituted for voltage-controlled delay unit 44 and feedback path 22 may be configured to generate a control current signal for controlling the delay function.

Figure 3:
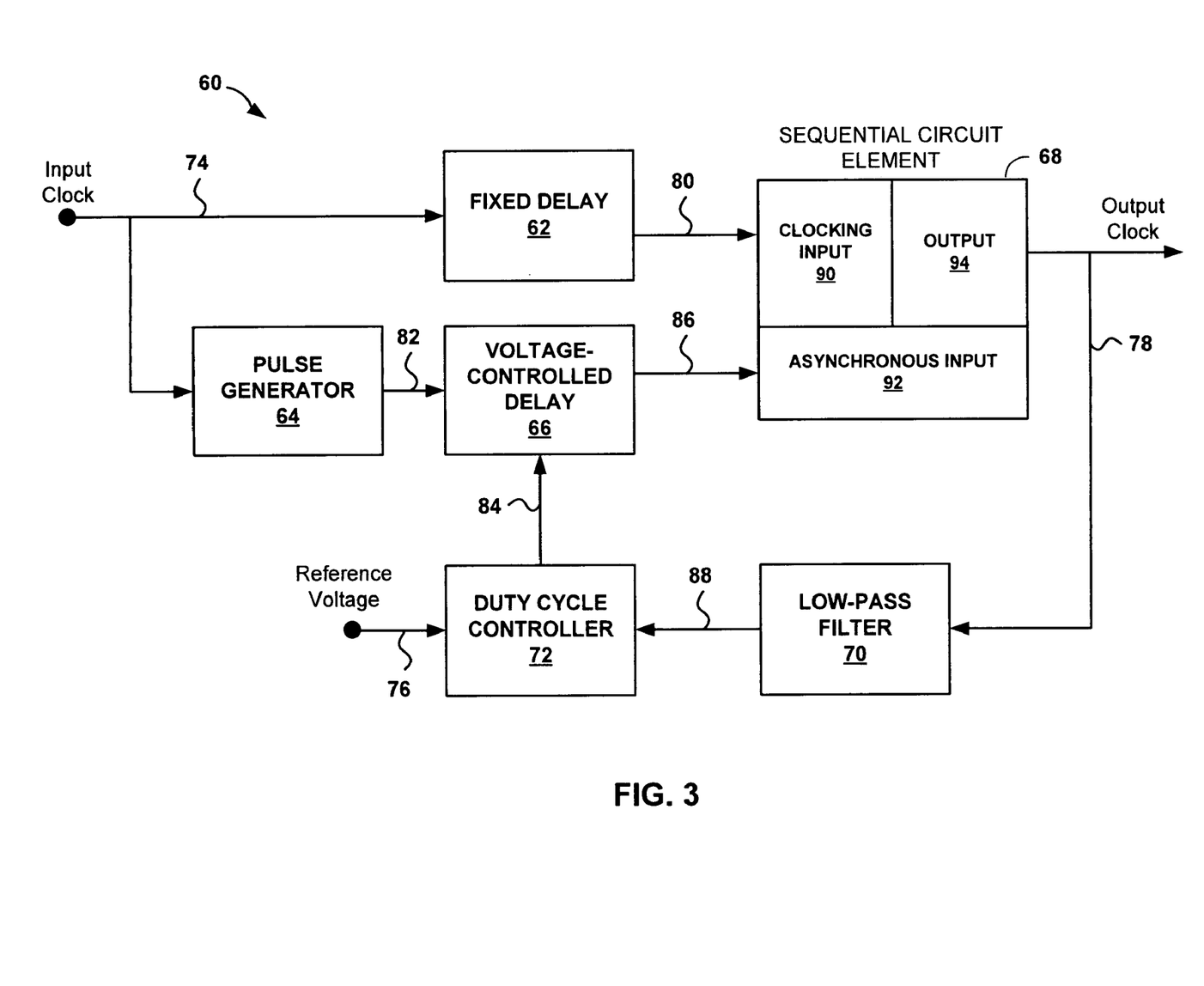
FIG. 3 is a block diagram illustrating another example DCC circuit device according to this disclosure.

FIG. 3 is a block diagram illustrating another example DCC circuit 60 device according to this disclosure. DCC circuit 60 may be used to form DCC circuit 14 of FIG. 1 or to form DCC circuit 40 of FIG. 2 in some examples. DCC circuit 60 is configured to adjust the falling edge of an input clock signal to produce an output clock signal having a duty cycle substantially equal to a desired duty cycle. DCC circuit 60 includes a fixed delay unit 62, a pulse generator 64, a voltage-controlled delay unit 66, a sequential circuit element 68, a low-pass filter 70, a duty cycle controller 72, an input clock signal 74, an input reference voltage 76, an output clock signal 78, and signal nodes 80, 82, 84, 86, 88.

DCC circuit 60 includes several components that are similar to components already described above with respect to DCC circuit 40 in FIG. 2. For example, pulse generator 64 and voltage-controlled delay unit 66 may correspond to pulse generator 42 and voltage-controlled delay unit 44, respectively, described above with respect to FIG. 2 and may be constructed using the same or similar components. In some examples, low-pass filter 70 and duty cycle controller 72 may be used to form feedback path 48 of DCC circuit 40 in FIG. 2. In additional examples, sequential circuit element 68 may be used to form edge adjustment circuit 46 of DCC circuit 40 in FIG. 2.

Fixed delay unit 62 is configured to delay input clock signal 74 by a fixed amount of delay to produce a delayed input clock signal 80. Applying a fixed delay to the rising edge of input clock signal 74 provides the same effect as applying a "negative delay" to the falling edge of input clock signal 74. This allows duty cycle correction circuit 60 to effectively reduce the duty cycle of output clock signal 78 with respect to input clock signal 74. In other words, by delaying the rising edge of input clock signal 74 by a fixed amount, duty cycle correction circuit 60 can generate an output clock 78 with a desired duty cycle that is less than the duty cycle of input clock signal 74.

It should be noted that the rising edge of input clock signal 74 is delayed by a fixed amount of delay as opposed to falling edge of input clock signal 74, which is delayed by a variable amount of delay. Thus, in examples that use fixed delay unit 62, the falling edge of input clock signal 74 is adjusted (i.e., the amount of delay is adjusted) while the rising edge of input clock signal 74 is not adjusted (i.e., the amount of delay is not adjusted).

Pulse generator 64 is configured to generate a pulse signal 82 in response to a falling edge of input clock signal 74. Voltage-controlled delay unit 66 is configured to delay pulse signal 82 based on a control voltage 84 from duty cycle controller 72 in order to produce delayed pulse signal 86.

Sequential circuit element 68 is configured to adjust the falling edge of delayed clock signal 80 based on delayed pulse signal 86 to produce output clock signal 78. Sequential circuit element 68 may operate as an edge adjustment circuit similar to edge adjustment circuit 46 of DCC circuit 40 (FIG. 2). Sequential circuit element 68 includes clocking input 90, asynchronous input 92, and output 94. Clocking input 90 receives delayed clock signal 80 and asynchronous input 92 receives delayed pulse signal 86. When clocking input 90 detects a positive transition within delayed clock signal 80 (e.g., a transition from a low logic value to a high logic value), sequential circuit element 86 forces output clock signal 78 to a high logic value. When asynchronous input 92 detects a pulse within pulse signal 86, sequential circuit element 68 forces output clock signal 78 to a low logic value. As used herein, an asynchronous input may refer to an input that is triggered or activated independent of clocking input 90. Thus, any pulse that occurs on pulse signal 86 activates sequential circuit element 68 to transition to a low logic value. Although not illustrated in FIG. 3, sequential circuit element 68 may include other synchronous and/or asynchronous inputs.

Low-pass filter 70 is configured to generate a voltage signal 88 substantially proportional to the duty cycle of output clock signal 78. In one example, low-pass filter 70 may be implemented as an analog first-order, single-pole low-pass filter, such as an RC filter. In other examples, low-pass filter 70 may be implemented with higher order filters. In some examples, a digital low-pass filter 70 may be substituted for low-pass filter 70. In any case, low-pass filter 70 removes high frequency components from output clock signal 78 in order to produce a voltage signal 88 that is effectively an average value of output clock signal 78. This average value is proportional to the duty cycle for output clock 78.

Duty cycle controller 72 is configured to adjust control voltage signal 84 such that control voltage signal 84 is substantially proportional to a difference between voltage signal 88 and an input reference voltage 76. In some examples, duty cycle controller 72 may include an operational amplifier that compares voltage signal 84 to reference voltage signal 76 and adjusts control signal 84 based on the comparison.

During operation of DCC circuit 60, an input clock signal is fed into fixed delay unit 62 and pulse generator 64. Fixed delay unit 62 delays clock signal 74 by a fixed amount and feeds the resulting delayed clock signal 80 into clocking input 90 of sequential circuit element 62. Pulse generator 64 generates a pulse within pulse signal 82 for each falling edge of clock signal 74. Voltage-controlled delay unit 66 delays pulse signal 82 by a variable amount of delay that is controlled by control voltage 84. The delayed pulse signal 86 is fed into asynchronous input 92 of sequential circuit element 68. Sequential circuit element 68 adjusts the falling edge of delayed clock signal 80 based on delayed pulse signal 86 to produce output clock signal 78.

Low-pass filter 70 produces a voltage signal 88 that is substantially proportion to the duty cycle of output clock signal 78. Duty cycle controller 72 compares the voltage signal 88 to a reference voltage signal, and adjusts control voltage 84 based on the comparison such that output clock signal 78 is regulated at a desired duty cycle.

Figure 4:
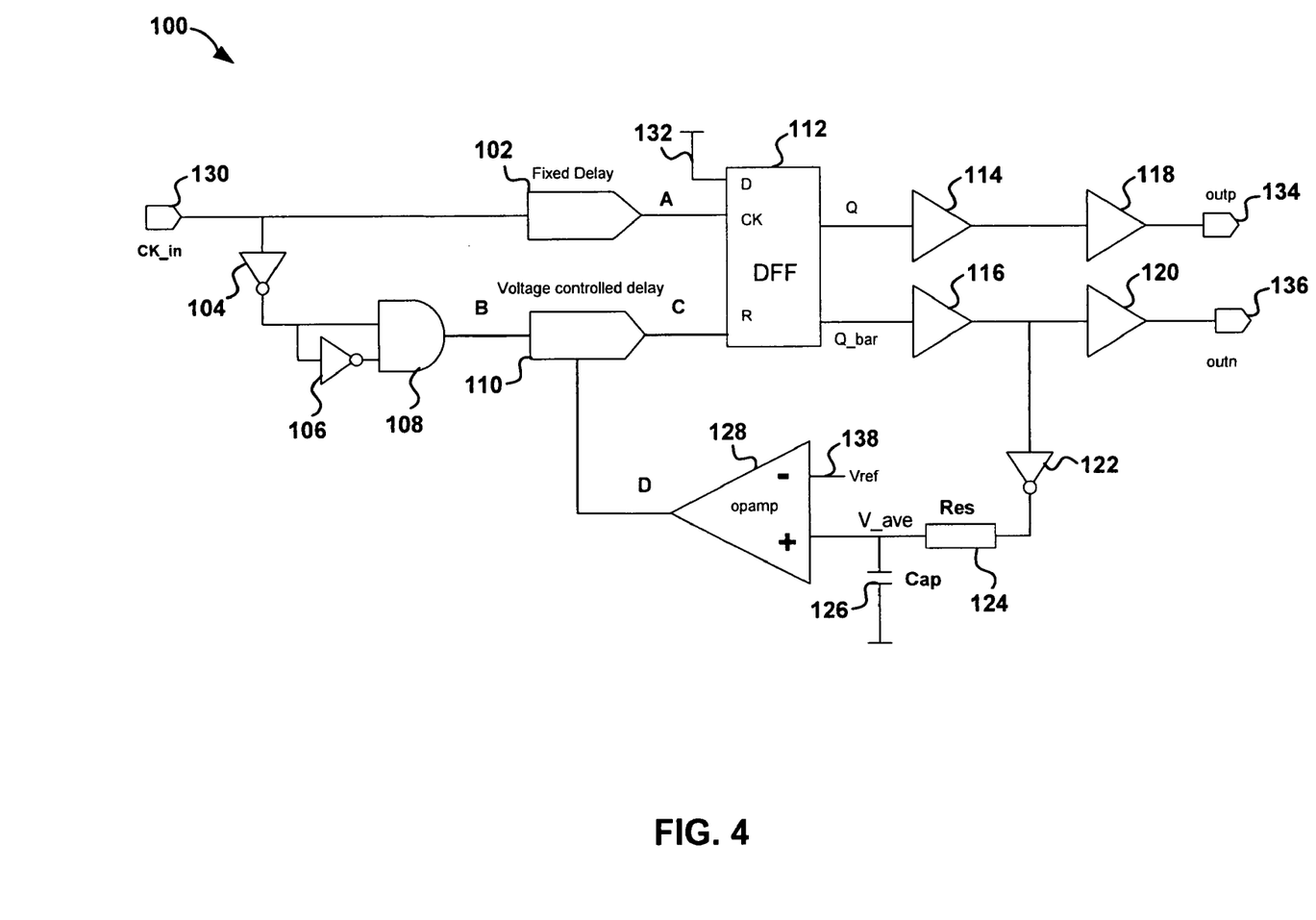
FIG. 4 is a schematic diagram illustrating another example DCC circuit device according to this disclosure.

FIG. 4 is a schematic diagram illustrating another example DCC circuit 100 device according to this disclosure. DCC circuit 100 is configured to adjust the falling edge of an input clock signal to produce an output clock signal having a duty cycle substantially equal to a desired duty cycle. DCC circuit 100 includes a fixed delay unit 102, inverters 104, 106, AND gate 108, a voltage-controlled delay 110, a flip-flop 112, buffers 114, 116, 118, 120, an inverter 122, a resistor 124, a capacitor 126, an operational amplifier 128, an input clock signal 130, a high logic voltage supply 132, and clock outputs 134, 136.

DCC circuit 100 includes several components that are similar to components already described above with respect to DCC circuit 60 of FIG. 3. For example, voltage-controlled delay unit 110 and fixed delay unit 102 may correspond to voltage-controlled delay unit 66 and fixed delay unit 62, respectively, described above with respect to FIG. 3 and may be constructed using the same or similar components. In some examples, inverters 104, 106 and AND gate 108 may be used to form pulse generator 64 in FIG. 3. In additional examples, flip-flop 112 and high logic voltage supply 132 may be used to form sequential circuit element 68 in FIG. 3. In further examples, resistor 124 and capacitor 126 may be used to form low-pass filter 70 in FIG. 3. In yet further examples, operational amplifier 128 may be used to form duty cycle controller 72 in FIG. 3.

A pulse generator may be defined to include inverters 104, 106 and AND gate 108. Inverter 104 reverses the polarity of input clock signal 130. Inverter 106 generates an inverted version of the reversed-polarity clock signal. AND gate 108 receives the reversed polarity clock signal and the inverted version of the reversed-polarity clock signal and applies a logic AND function to the signals. Since inverter 106 produces a slight delay, the inverted version of the reversed-polarity clock signal is slightly delayed with respect to the reversed-polarity clock signal generated by inverter 104. This causes AND gate 108 to produce a high logic voltage pulse that has a pulse width substantially equal to the delay caused by inverter 106.

By generating a pulse based on the falling edge of the incoming clock signal, rather than the rising edge, a more compact delay circuit can be implemented because the operating range of the delay parameter is effectively reduced. In addition, when the pulse is based on the falling edge of the incoming clock signal, the overall amount of delay required for the pulse signal can be reduced thereby allowing for more stable operation of the clock synthesizer control loop.

An edge adjustment circuit may be defined to include flip-flop 112 and high logic voltage supply 132. Flip-flop 112 may be a positive edge-triggered D-flip-flop with a clock input (CK), an asynchronous reset input (R), a data input (D), a non-inverted output (Q), and an inverted output (Q_bar). The clock input detects a rising edge of the delayed clock signal and forces the non-inverted output to a high logic value and the inverted output to a low logic value. The asynchronous reset input detects a pulse in the delayed pulse signal and forces the non-inverted output to a low logic value and the inverted output to a high logic value.

It should be understood that flip-flop 112 depicted in FIG. 4 is merely exemplary and other types of sequential circuit elements can be substituted for flip-flop 112 without departing from the scope of this disclosure. For example, JK, SR, or D latches and/or flip-flops can be used to implement flip-flop 112. In some examples, the triggering or clocking for flip-flop 112 may be implemented as edge-triggered clocking or as pulse-triggered clocking.

A low-pass filter may be defined to include resistor 124 and capacitor 126. The low-pass filter receives an inverted version of the inverted output of D-flip-flop. The resistance and capacitance values are selected to such that the voltage with respect to ground at the non-inverting input of operational amplifier 128 is proportional to a duty cycle of output clock signal 134, 136.

A duty cycle controller may be defined to include operational amplifier 128. Operational amplifier 128 may operate in a linear range, as opposed to a saturation range, to generate a signal that is substantially proportional to a difference between the voltage generated by the low-pass filter and a reference voltage. A small amount of common mode voltage may also appear on the output of operational amplifier 128, but the main signal component, which is the differential mode component, is substantially proportional to the difference between the input signals. In this manner, operational amplifier 128 generates an output voltage signal substantially proportional to a difference between the first voltage and a reference voltage. By using a reference voltage within an analog feedback loop, as opposed to a digital feedback loop or state machines, the desired duty cycle can be more precisely programmed and/or adjusted.

Clock input 130 is coupled to fixed delay unit 102 and to the input of inverter 104. The output of inverter 104 is coupled the input of inverter 106 and one input of AND gate 108. The output of AND gate 108 is coupled to voltage-controlled delay unit 110. The output of fixed delay unit 102 is coupled to a clock input of D-flip-flop 112. The output of voltage-controlled delay unit 110 is coupled to an asynchronous reset input of D-flip-flop 112. A high voltage source 132 corresponding to a high logic value is coupled to the data input of D-flip-flop 112. The non-inverted output of D-flip-flop 112 is coupled to the input of buffer 114. The output of buffer 114 is coupled to the input of buffer 118.

The output of buffer 118 constitutes non-inverted clock output 134. The inverted output of D-flip-flop 112 is coupled to the input of buffer 116. The output of buffer 116 is coupled to the input of buffer 120 and to the input of inverter 122. The output of buffer 120 constitutes inverted clock output 136. The output of inverter 122 is coupled to a first terminal of resistor 124. A second terminal of resistor 124 is coupled to a first terminal of capacitor 126. A second terminal of capacitor 126 is couple to a ground voltage. The first terminal of capacitor 26 is coupled to a non-inverting input of operational amplifier 128. Reference voltage 138 is coupled to an inverting input of operational amplifier 128. The output of operational amplifier 128 is coupled to the control voltage input of voltage controlled delay unit 110.

Figure 5:
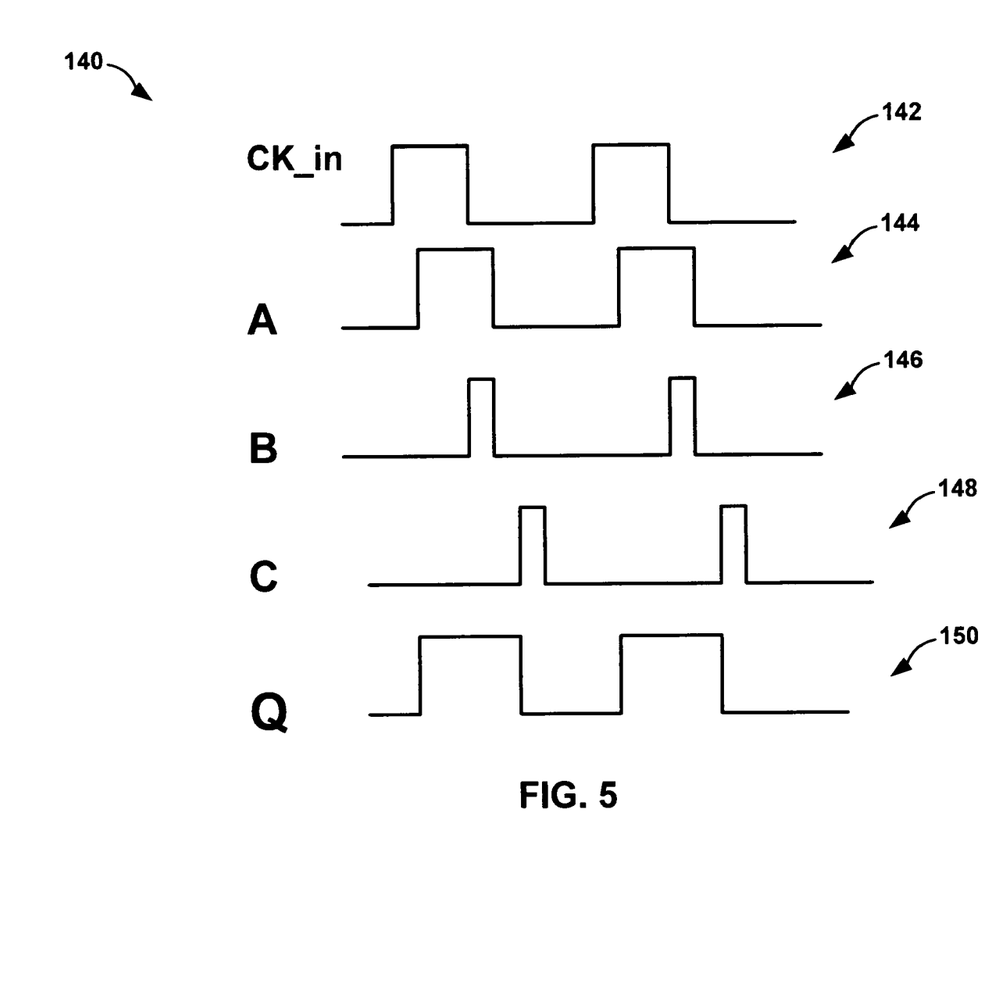
FIG. 5 is a timing diagram illustrating the timing of several signals within the example DCC of FIG. 4.

FIG. 5 is a timing diagram 140 illustrating the timing of several signals within the example DCC circuit 100 of FIG. 4. Timing diagram 140 includes an input clock signal 142, a fixed delay clock signal 144, a pulse signal 146, a delayed pulse signal 148, and an output signal 150.

Input clock signal 142 may correspond to the signal at input 130 of DCC circuit 100. Fixed delay clock signal 144 may correspond to the signal that is at the output of fixed delay unit 102 in DCC circuit 100. Pulse signal 146 may correspond to the signal that is at the output of AND gate 108 of the pulse generator in DCC circuit 100. Delayed pulse signal 148 may correspond to the signal at the output of voltage-controlled delay unit 110 in DCC circuit 100. Output signal 150 may correspond to the signal at output terminal 134 of DCC circuit 100.

As shown in FIG. 5, input clock signal 142 is a substantially periodic clock signal that may have an uncorrected duty cycle. Fixed delay unit 102 produces fixed delay clock signal 144 having a fixed delay with respect to input clock signal 142. The pulse generator produces pulse signal 146, which has a pulse for each falling edge of input clock signal 142. Voltage-controlled delay 110 produces delayed pulse signal 148. Finally D-flip-flop 112 adjusts the falling edge of fixed delay clock signal 144 to produce an output clock signal 150 having a corrected duty cycle.

Figure 6:
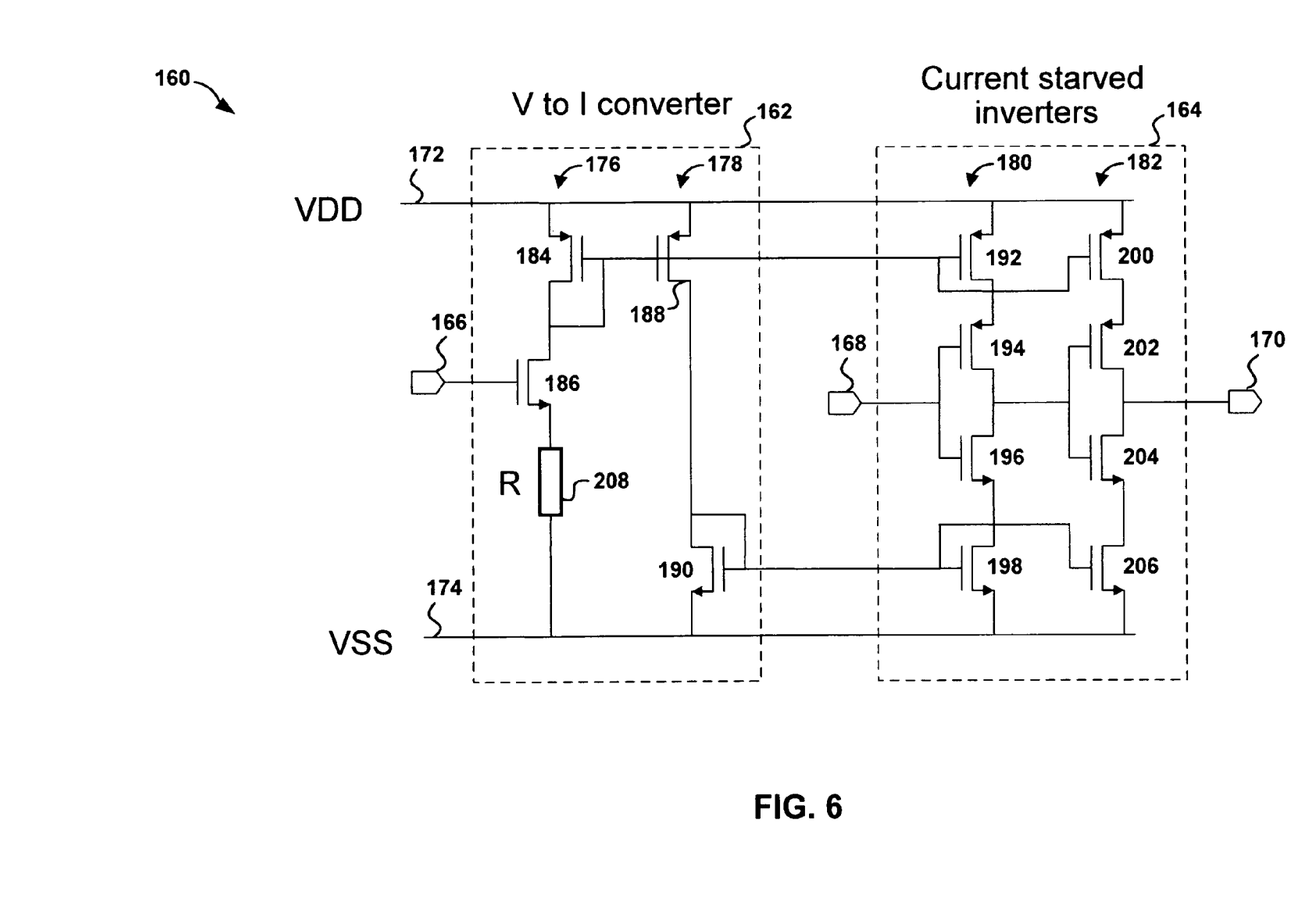
FIG. 6 is a schematic diagram illustrating a voltage-controlled delay element for use in any of the DCC circuits of this disclosure.

FIG. 6 is a schematic diagram illustrating a voltage-controlled delay element 160 for use in any of the DCC circuits of this disclosure. Voltage-controlled delay element 160 includes a voltage-to-current converter 162, one or more current-starved inverters 164, a control voltage input signal, an input signal 168 and an output signal 170. In one example, input signal 168 may be coupled to the output of a pulse generator.

Voltage-controlled delay element 160 also includes circuit legs 176, 178, 180 and 182. Leg 176 includes transistors 184, 186 and resistor 208. Transistor 186 controls the amount of current flowing through leg 176 based on control voltage input 166. As the voltage with respect to ground of control voltage signal 166 increases, the current through leg 176 increases. As the voltage with respect to ground of control voltage signal 166 decreases, the current through leg 176 decreases. Transistor 184 acts as an input transistor for a plurality of current mirrors. Resistor 208 limits the amount of current that can flow through leg 176 for proper operation of the circuit.

Leg 178 includes transistors 188, 190. A first current mirror is formed by transistors 184, 188. The first current mirror generates a current through leg 178 that is substantially proportional to the current traveling through leg 176. Transistor 190 acts as an input transistor for a plurality of current mirrors.

Leg 180 includes transistors 192, 194, 196, 198. Transistors 194, 196 operate as switches to form an inverter circuit. Transistor 192 controls the rate at which node 210 charges when transistor 194 is turned on. Transistor 198 controls the rate at which node 210 discharges when transistor 196 is turned on.

A second current mirror is formed by transistors 184, 192, and a third current mirror is formed by transistors 190, 198. The second current mirror generates a current at the drain terminal of transistor 192 that is substantially proportional to the current traveling through leg 176. The third current mirror generates a current at the drain terminal of transistor 198 that is substantially proportional to the current traveling through leg 178. Since the current traveling through leg 178 is substantially proportional to the current traveling through leg 176, the current generated by the third current mirror is also substantially proportional to the current traveling through leg 176.

Leg 182 includes transistors 200, 202, 204, 206. Transistors 202, 204 operate as switches to form an inverter circuit. Transistor 200 controls the rate at which node 170 charges when transistor 202 is turned on. Transistor 206 controls the rate at which node 170 discharges when transistor 204 is turned on.

A fourth current mirror is formed by transistors 184, 200, and a fifth current mirror is formed by transistors 190, 206. The fourth current mirror generates a current at the drain terminal of transistor 200 that is substantially proportional to the current traveling through leg 176. The fifth current mirror generates a current at the drain terminal of transistor 206 that is substantially proportional to the current traveling through leg 178. Since the current traveling through leg 178 is substantially proportional to the current traveling through leg 176, the current generated by the fifth current mirror is also substantially proportional to the current traveling through leg 176.

Because the output currents of all five current mirrors are substantially proportional to the current traveling through leg 176, the output currents of all five current mirrors are substantially proportional to each other. The degree of proportionality (i.e., the proportionality constant) is determined by the ratio of the transistor sizing ratios.

Voltage-to-current converter 162 is configured to convert control voltage input signal 166 to an amount of current in leg 176 that is proportional to the voltage of control voltage signal 166. The amount of current in leg 176 is mirrored to leg 178 and to the current-starved inverters 164. Current-starved inverters 164 are configured to delay the input signal based on the current signal. The amount of current mirrored to legs 180, 182 determines the rate at which nodes 210 and 170 can charge and discharge. As control voltage 166 increases, the current traveling through legs 180, 182 also increases. This causes the charge/discharge rate of the current-starved inverters 164 to increase, which in turn causes the amount of delay between input signal 168 and output signal 170 to decrease. Similarly, as control voltage 166 decreases, the current traveling through legs 180, 182 also decreases. This causes the charge/discharge rate of the current-starved inverters 164 to decrease, which in turn causes the amount of delay between input signal 168 and output signal 170 to increase.

Transistors 186, 190, 196, 198, 204, 206 may be implemented as n-type metal-oxide-semiconductor (NMOS) transistors, and transistors 184, 188, 192, 194, 200, 202 may be implemented as p-type metal-oxide-semiconductor (PMOS) transistors. It should be noted, however, that npn-type bipolar junction transistors (npn-BJTs) and pnp-type bipolar junction transistors (pnp-BJTs) may be substituted for one or more of the nMOS transistors and the pMOS transistors. In such cases, it is understood that, when this disclosure refers to the gate terminal of a MOS transistor, the disclosure may also be referring to the base terminal of a BJT. Similarly, when the disclosure refers to the source terminal or the drain terminal of a MOS transistor, the disclosure may also be referring to the emitter terminal or the collector terminal of a BJT respectively.

Figure 7:
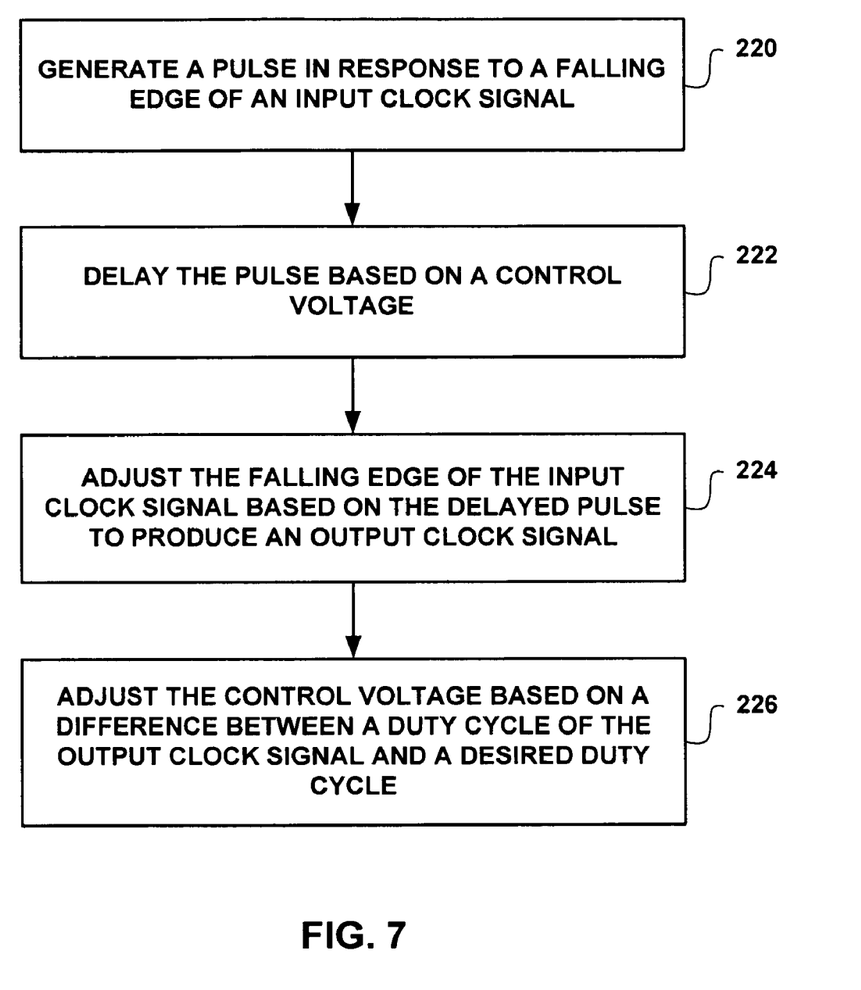
FIG. 7 is a flow diagram illustrating an example method for adjusting a duty cycle of a clock signal according to this disclosure.

FIG. 7 is a flow diagram illustrating an example method for adjusting a duty cycle of a clock signal according to this disclosure. Although described with respect to DCC circuit 40 of FIG. 2, the techniques depicted in FIG. 7 may be implemented in any of the devices or systems of FIGS. 1-4. Pulse generator 42 generates a pulse in response to a falling edge of an input clock signal (220). Voltage-controlled delay unit 44 delays the pulse based on a control voltage (222). Edge adjustment circuit 46 adjusts the falling edge of the input clock signal based on the delayed pulse to produce an output clock signal (224). Feedback path 48 adjusts the control voltage based on the difference between a duty cycle of the output clock signal and a desired duty cycle (226).

Figure 8:
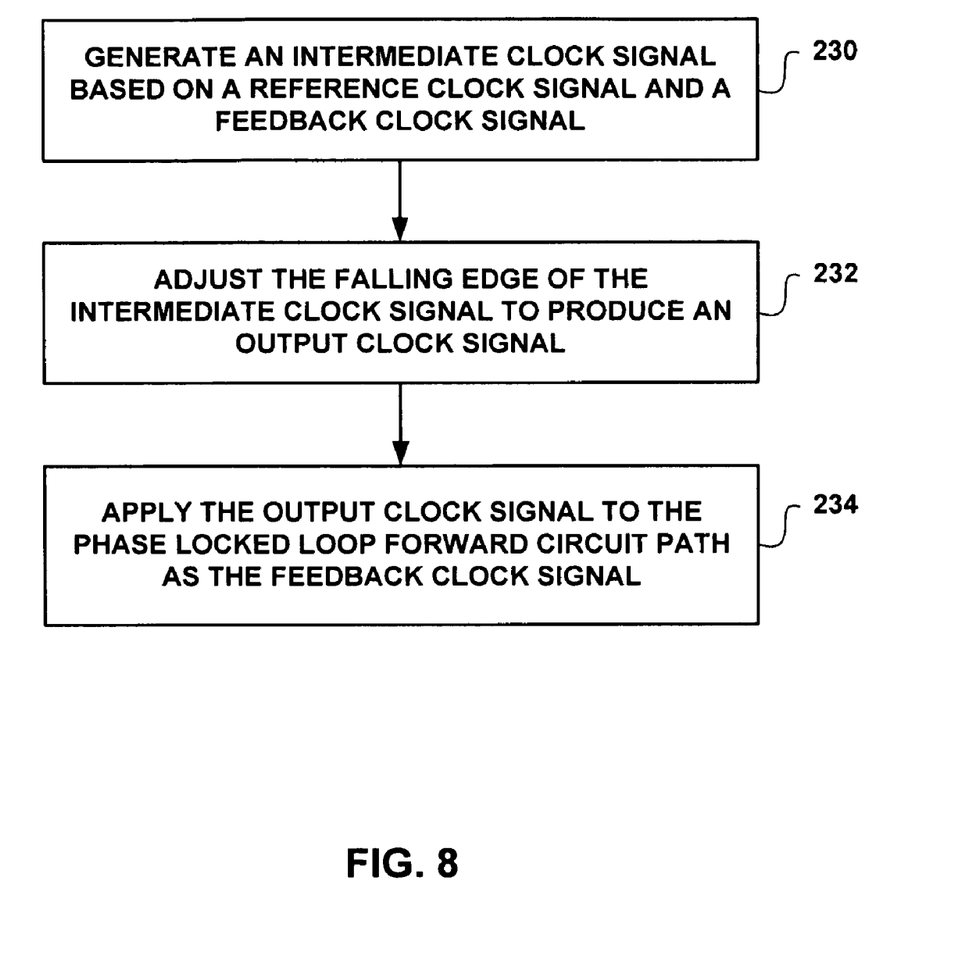
FIG. 8 is a flow diagram illustrating an example method for generating a phase-aligned and duty cycle corrected clock signal.

FIG. 8 is a flow diagram illustrating an example method for generating a phase-aligned and duty cycle corrected clock signal. As an example, the techniques depicted in FIG. 8 may be implemented in clock synthesizer system 10 described above with respect to FIG. 1. PLL forward circuit path 12 generates an intermediate clock signal based on a reference clock signal and a feedback clock signal (230). Duty cycle correction circuit 14 adjusts the falling edge of the intermediate clock signal to produce an output clock signal (232). A feedback path applies the output clock signal to the phase-locked loop forward circuit path as the feedback clock signal (234).

Figure 9:
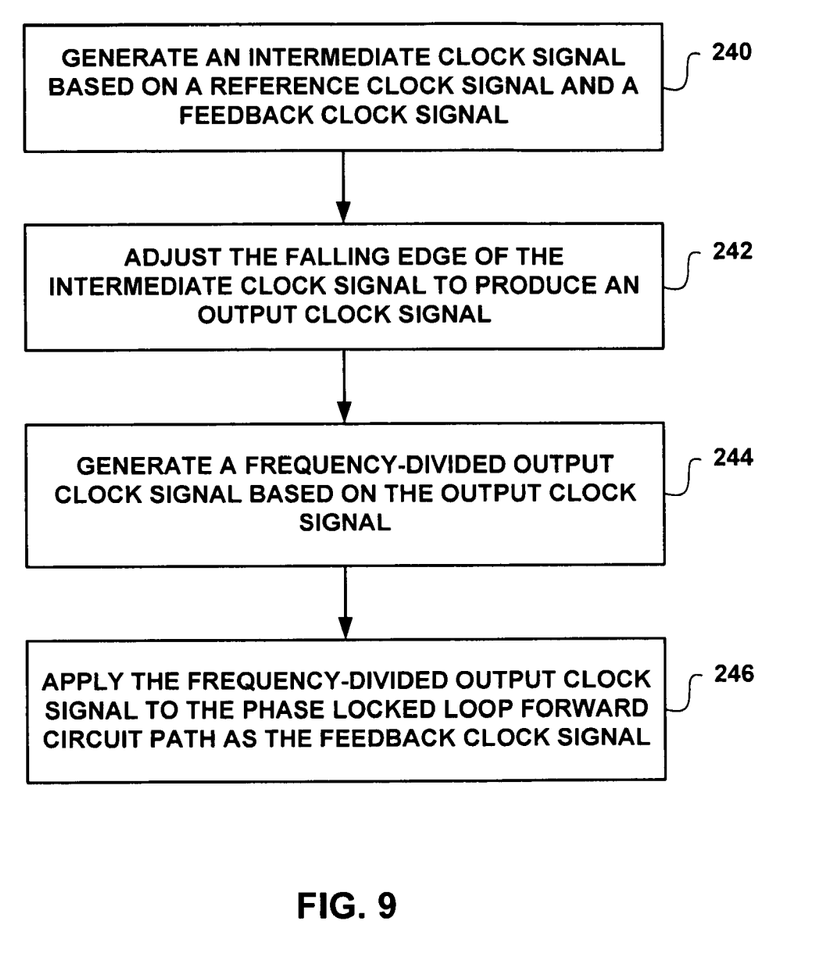
FIG. 9 is a flow diagram illustrating an example method for generating a phase-aligned and duty cycle corrected clock signal.

FIG. 9 is a flow diagram illustrating an example method for generating a phase-aligned and duty cycle corrected clock signal. As an example, the techniques depicted in FIG. 8 may be implemented in clock synthesizer system 10 described above with respect to FIG. 1. PLL forward circuit path 12 generates an intermediate clock signal based on a reference clock signal and a feedback clock signal (240). Duty cycle correction circuit 14 adjusts the falling edge of the intermediate clock signal to produce an output clock signal (242).

Frequency divider 16 generates a frequency-divided output clock signal based on the output clock signal (244). A feedback path 22 applies the frequency-divided output clock signal to the phase-locked loop forward circuit path as the feedback clock signal (246).

The circuit components described in this disclosure can be implemented as discrete components, as one or more integrated devices, or any combination thereof. The circuit components described herein may be fabricated using any of a wide variety of process technologies include CMOS process technologies. In addition, the circuitry described herein may be used in various applications including telecommunications applications, general computing application, or any application that utilizes a clock generation and distribution system.

Various aspects of the disclosure have been described. These and other aspects are within the scope of the following claims.

The invention claimed is:

1. A duty cycle correction (DCC) circuit device comprising:
   a pulse generator configured to generate a pulse in response to a falling edge of an input clock signal;
   a voltage-controlled delay circuit configured to delay the pulse based on a control voltage;
   an edge adjustment circuit configured to adjust the falling edge of the input clock signal based on the delayed pulse to produce an output clock signal; and
   a feedback circuit path configured to adjust the control voltage based on a difference between a duty cycle of the output clock signal and a desired duty cycle.

2. The device of claim 1, wherein the edge adjustment circuit comprises a sequential circuit element having an asynchronous control input, and wherein the sequential circuit element is configured to reset the output clock signal to a low logic voltage when the delayed pulse activates the asynchronous control input.

3. The device of claim 2, wherein the sequential circuit element is configured to set the output clock signal to a high logic voltage when a positive transition occurs within at least one of the input clock signal or a delayed version of the input clock signal.

4. The device of claim 1, wherein the edge adjustment circuit comprises a positive-edge triggered D-flip-flop having an asynchronous reset input and a clocking input, wherein the asynchronous reset input is coupled to the delayed pulse, and wherein the clocking input is coupled to at least one of the input clock signal or a delayed version of the input clock signal.

5. The device of claim 1, wherein the feedback circuit path comprises:
   a low-pass filter configured to generate a first voltage substantially proportional to the duty cycle of the output clock; and
   an operational amplifier configured to generate a second voltage substantially proportional to a difference between the first voltage and a reference voltage, and to output the second voltage as the control voltage.

6. The device of claim 5, wherein the reference voltage is selected based on the desired duty cycle to produce the output clock signal having the desired duty cycle.

7. The device of claim 1, wherein the feedback circuit path is an analog circuit.

8. The device of claim 1, further comprising:
   a fixed delay circuit configured to delay the input clock signal by a fixed amount of delay to produce a delayed input clock signal, wherein the edge adjustment circuit adjusts the falling edge of the delayed input clock signal based on the delayed pulse to produce the output clock signal.

9. The device of claim 1, wherein the voltage-controlled delay circuit comprises:
   a voltage-to-current converter configured to convert the control voltage to a current signal; and
   one or more current-starved inverters configured to delay the pulse based on the current signal.

10. A method comprising:
    generating a pulse in response to a falling edge of an input clock signal; delaying the pulse based on a control voltage;
    adjusting the falling edge of the input clock signal based on the delayed pulse to produce an output clock signal; and
    adjusting the control voltage based on a difference between a duty cycle of the output clock signal and a desired duty cycle.

11. The method of claim 10, wherein adjusting the falling edge of the input clock signal comprises resetting the output clock signal to a low logic voltage when the delayed pulse activates an asynchronous control input of a sequential circuit element.

12. The method of claim 11, wherein adjusting the falling edge of the input clock signal further comprises setting the output clock signal to a high logic voltage when a positive transition occurs within at least one of the input clock signal or a delayed version of the input clock signal.

13. The method of claim 10, wherein adjusting the falling edge of the input clock signal comprises adjusting the falling edge of the input clock signal with a positive-edge triggered D-flip-flop having an asynchronous reset input and a clocking input, wherein the asynchronous reset input is coupled to the delayed pulse, and wherein the clocking input is coupled to at least one of the input clock signal or a delayed version of the input clock signal.

14. The method of claim 10, wherein adjusting the control voltage comprises:
    generating a first voltage substantially proportional to the duty cycle of the output clock; and
    generating a second voltage substantially proportional to a difference between the first voltage and a reference voltage, wherein the second voltage is output as the control voltage.

15. The method of claim 14, wherein the reference voltage is selected based on the desired duty cycle to produce the output clock signal having the desired duty cycle.

16. The method of claim 10, wherein adjusting the control voltage comprises adjusting the control voltage with an analog feedback circuit.

17. The method of claim 10, further comprising:
    delaying the input clock signal by a fixed amount of delay to produce a delayed input clock signal, wherein adjusting the falling edge of the input clock signal comprises adjusting the falling edge of the delayed input clock signal based on the delayed pulse to produce the output clock signal.

18. The method of claim 10, wherein delaying the pulse based on the control voltage comprises:
    converting the control voltage to a current signal; and
    delaying the pulse with one or more current-starved inverters based on the current signal.

19. A clock synthesizer comprising:
a phase-locked loop forward circuit path configured to generate an intermediate clock signal based on a reference clock signal and a feedback clock signal;
a duty cycle correction DCC circuit configured to adjust the falling edge of the intermediate clock signal to produce an output clock signal; and
a first feedback circuit path configured to apply the output clock signal to the phase-locked loop forward circuit path as the feedback clock signal,
wherein the DCC comprises:
  a pulse generator configured to generate a pulse in response to the falling edge of the intermediate clock signal;
  a voltage-controlled delay circuit configured to delay the pulse based on a control voltage;
  an edge adjustment circuit configured to adjust the falling edge of the intermediate clock signal based on the delayed pulse to produce the output clock signal; and
  a second feedback circuit path configured to adjust the control voltage based on a difference between a duty cycle of the output clock signal and a desired duty cycle.

20. The clock synthesizer or claim 19, wherein the first feedback circuit path comprises a frequency divider configured to generate a frequency-divided output clock signal based on the output clock signal, and wherein the first feedback circuit path is further configured to apply the frequency-divided output clock signal to the phase-locked loop forward circuit path as the feedback clock signal.

* * * * *